(12) United States Patent
Maruyama (10) Patent No.: US 11,659,651 B2
(45) Date of Patent: May 23, 2023

(54) ELECTRONIC CONTROL DEVICE (71) Applicant: Hitachi Astemo, Ltd., Hitachinaka (JP)

(72) Inventor: Kazuo Maruyama, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 17/719,584

(22) Filed: Apr. 13, 2022

(65) Prior Publication Data
US 2022/0386454 A1 Dec. 1, 2022

(30) Foreign Application Priority Data

May 28, 2021 (JP) .............................. JP2021-089804

(51) Int. Cl.
*H05K 1/02* (2006.01)
*H05K 1/03* (2006.01)
*H05K 1/11* (2006.01)
*H05K 3/00* (2006.01)

(52) U.S. Cl.
CPC ......... *H05K 1/0271* (2013.01); *H05K 1/0306* (2013.01); *H05K 1/116* (2013.01); *H05K 3/0067* (2013.01); *H05K 3/0094* (2013.01); *H05K 2201/029* (2013.01); *H05K 2201/0212* (2013.01); *H05K 2201/0347* (2013.01); *H05K 2201/0355* (2013.01); *H05K 2201/0959* (2013.01)

(58) Field of Classification Search
CPC .... H05K 1/0271; H05K 1/0306; H05K 1/116; H05K 3/0067; H05K 3/0094
See application file for complete search history.

(56) References Cited

FOREIGN PATENT DOCUMENTS

JP 2019-046894 3/2019

*Primary Examiner* — Jeremy C Norris
(74) *Attorney, Agent, or Firm* — Rankin, Hill & Clark LLP (57) ABSTRACT The casing of an electronic control device includes a casing-side contact surface in contact with the end of a printed-circuit board. A cover includes a cover-side contact surface holding the end of the printed-circuit board together with the casing-side contact surface by being in contact with the end of the printed-circuit board. In the printed-circuit board, a held portion held between the casing-side contact surface and the cover-side contact surface is provided with a through-hole via.

12 Claims, 5 Drawing Sheets

ELECTRONIC CONTROL DEVICE

FIELD OF THE INVENTION

The present disclosure relates to an electronic control device that includes a casing which stores therein a printed-circuit board.

BACKGROUND

Electronic control devices are loaded on a vehicle as an engine control unit and an automatic transmission control unit, etc. In general, an electronic control device includes a printed-circuit board on which electronic components are mounted, and a housing that stores therein the printed-circuit board. JP2019-46894 A discloses a conventional technology regarding such an electronic control device.

The housing of the electronic control device disclosed in JP2019-46894 A includes a casing which is provided with an opening and which stores therein a printed-circuit board, and a cover that blocks off the opening of the casing.

The printed-circuit board is fastened to the casing by screws in the casing. More specifically, provided inside the casing are support portions that support respective ends of the printed-circuit board. A female-screw hole is formed in the contact surface of each support portion which is in contact with the printed-circuit board. The end of the printed-circuit board has a through-hole through which a screw passes completely through. When the screw is tightened with the female-screw hole of the support portion of the casing, the end of the printed-circuit board is held between the head of the screw and the support portion.

When the end of the printed-circuit board is held between the head of the screw and the support portion of the casing, the end of the printed-circuit board is compressed. Compression of the end of the printed-circuit board causes stress at portions which are located around the end of the printed-circuit board and to which respective electronic components are soldered. This may decrease the connection reliability between the electronic components and the printed-circuit board.

An objective of the present disclosure is to provide an electronic control device capable of reducing stress caused at a portion of a printed-circuit board on which an electronic component is soldered.

SUMMARY OF THE INVENTION

In order to accomplish the above objective, an electronic control device according to the present disclosure includes:
  a casing which is provided with an opening and which stores therein a printed-circuit board; and
  a cover that blocks off the opening of the casing.
  An outer circumferential edge of the cover is fastened so as to be laid over on an edge of the opening of the casing and so as to be aligned with each other.
  The casing includes a casing-side contact surface that is in contact with an end of the printed-circuit board at an internal side relative to the edge of the opening of the casing.
  The cover includes a cover-side contact surface that holds the end of the printed-circuit board together with the casing-side contact surface by being in contact with the end of the printed-circuit board.
  In the printed-circuit board, a held portion held between the casing-side contact surface and the cover-side contact surface is provided with a through-hole via.

That is, the casing of the electronic control device includes the casing-side contact surface that is in contact with the end of the printed-circuit board. The cover includes the cover-side contact surface that holds the end of the printed-circuit board together with the casing-side contact surface by being in contact with the end of the printed-circuit board. In comparison with a case in which the printed-circuit board is fastened to the casing using screws, it can be held with a further large area with respect to the end of the printed-circuit board. This can distribute compression force applied to the end of the printed-circuit board. Also, this can reduce stresses produced at portions of the printed-circuit board which are around the end of such a board and to which respective electronic components are soldered.

In addition, in the printed-circuit board, a held portion held between the casing-side contact surface and the cover-side contact surface is provided with a through-hole via. Since the through-hole via becomes a cylindrical reinforcement member that extends in the thickness direction of the printed-circuit board, the strength of the printed-circuit board in the thickness direction can be enhanced.

It is preferable that a copper foil should be provided on a surface of the held portion of the printed-circuit board, and a hole of the through-hole via should passe completely through the copper foil. Hence, the insulating layer (a base material) of the printed-circuit board can be protected, and the strength of the printed-circuit board in the thickness direction can be enhanced.

It is preferable that a hole of the through-hole via should be filled by a filler member, a surface of the held portion of the printed-circuit board should be provided with a plating portion formed by plating, and the plating portion should cover the through-hole via and the filler member. Since the hole of the through-hole via is filled by the filler member, the through-hole via can be reinforced, and thus the strength of the held portion of the printed-circuit board in the thickness direction can be enhanced. Moreover, the surface of the held portion of the printed-circuit board is provided with the plating portion formed by plating. The plating portion covers the through-hole via and the filler member. Accordingly, the contact area of the plating portion to the casing and to the cover increases, improving a heat dissipation effect.

It is preferable that the printed-circuit board should be formed by laminating a plurality of insulating layers, and with reference to a thickness direction of the printed-circuit board, an elastic modulus of an outermost layer located at the outermost side should be lower than an elastic modulus of an adjacent layer adjacent to the outermost layer. Since the outermost layer of the printed-circuit board is likely to be deformed, force produced by being held between the cover-side contact area and the casing-side contact area can be distributed across the entire printed-circuit board. This can ease stress produced at a portion to which an electronic component is soldered.

It is preferable that a plurality of the casing-side contact surfaces and a plurality of the cover-side contact surfaces should be provided, and the plurality of the casing-side contact surfaces and the plurality of the cover-side contact surfaces are placed along a pair of edges of the printed-circuit board which extend in a same direction. Since both ends of the printed-circuit board are supported, the printed-circuit board can be surely fastened to the casing.

DETAILED DESCRIPTION OF THE EMBODIMENTS

Embodiments of the present disclosure will be described below with reference to the accompanying figures.

First Embodiment

Figure 1:
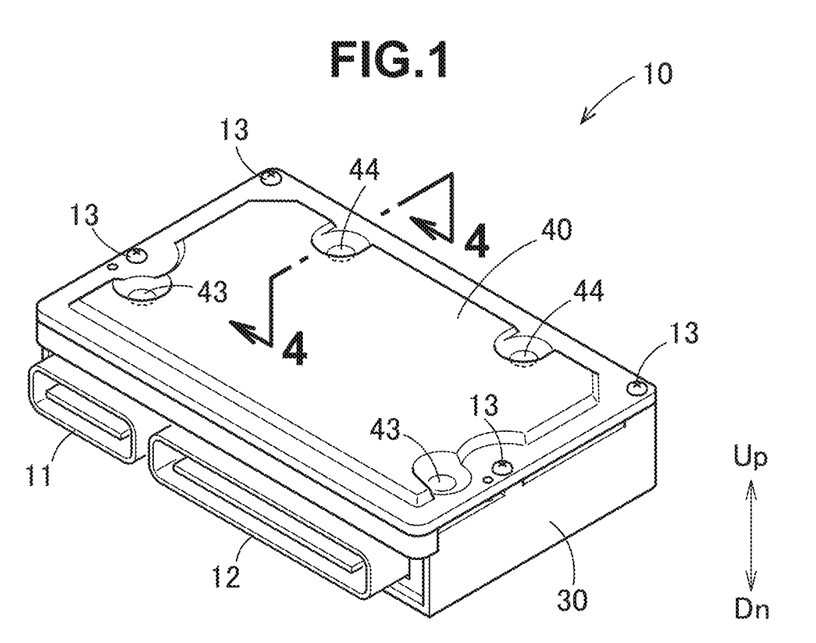
FIG. 1 is a perspective view of an electronic control device according to a first embodiment.

FIG. 1 illustrates an electronic control device 10 applicable to an engine control unit, etc., according to a first embodiment, and it is attachable to a vehicular body of a vehicle (e.g., a four-wheel vehicle).

Figure 2:
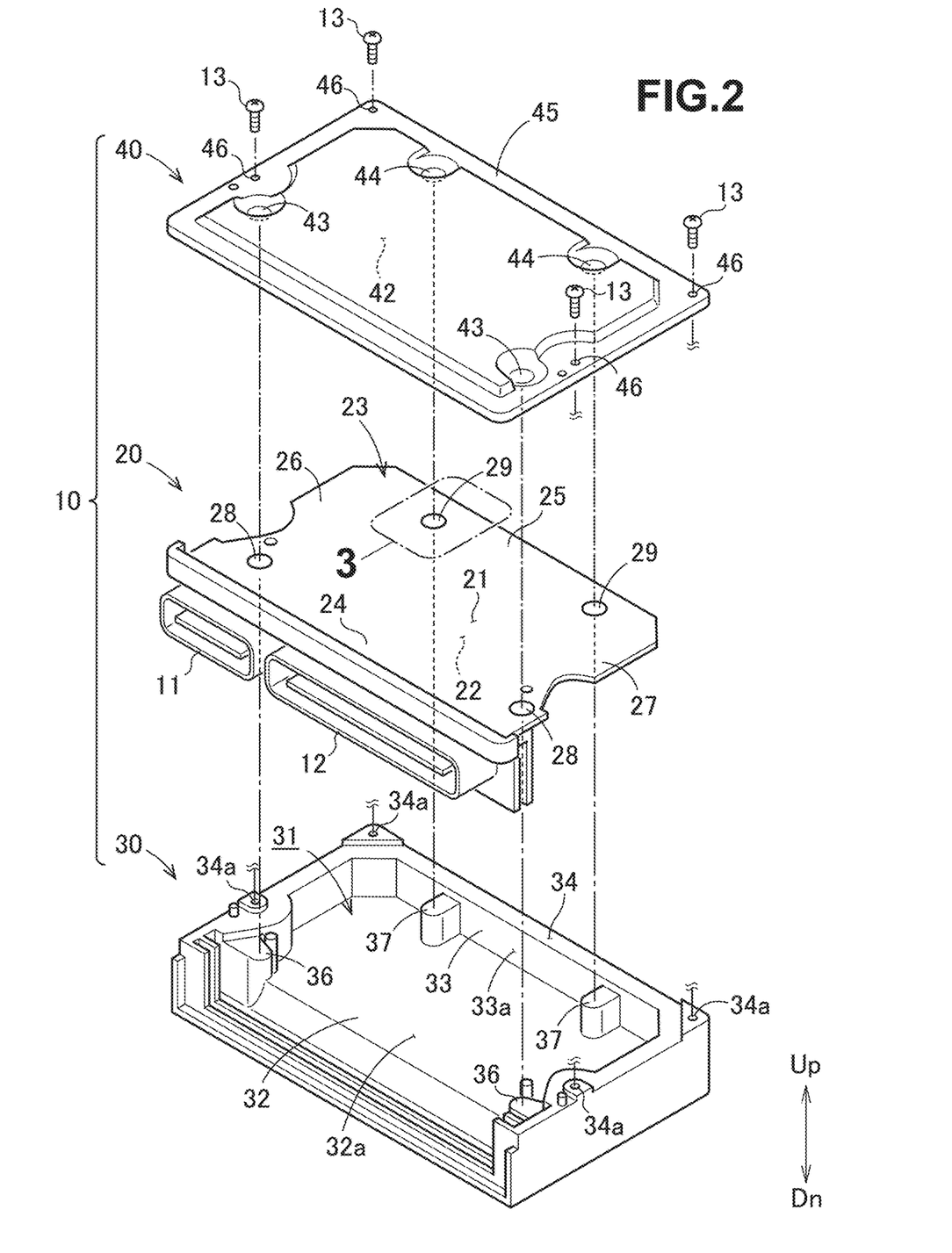
FIG. 2 is an exploded perspective view of the electronic control device illustrated in FIG. 1.

With reference to FIG. 1 and FIG. 2, the electronic control device 10 includes a printed-circuit board 20 that has the wiring pattern of an unillustrated electronic circuit, a casing 30 which is provided with an opening 31 opened upwardly and which stores therein the printed-circuit board 20, and a cover 40 that blocks off the opening 31 of the casing 30.

In order to facilitate understanding, the thickness direction of the printed-circuit board 20 will be defined as a vertical direction. In the figures, "Up" indicates an upper side, and "Dn" indicates a down side. Note that the vertical direction does not always correspond to a state of the electronic control device 10 that is being attached to the vehicular body.

Printed-Circuit Board

Unillustrated electronic components are mounted on an upper surface 21 of the printed-circuit board 20 and on a lower surface 22 thereof. An end 23 of the printed-circuit board 20 has a pair of longer edges 24 and 25 (a pair of edges) along the lengthwise direction of the printed-circuit board 20, and a pair of shorter edges 26 and 27 along a short-side direction of the printed-circuit board 20. In the pair of the longer edges 24 and 25, the one at which two connectors 11 and 12 that can be connected to an external device will be defined as a first longer edge 24, and the one that is the pair of the first longer edge 24 will be defined as a second longer edge 25.

Casing

The casing 30 is formed of a metal with an excellent thermal conductivity like aluminum (an aluminum die-cast), and is formed in a box shape. More specifically, the casing 30 includes a tabular bottom portion 32 that faces the lower surface 22 of the printed-circuit board 20, and a wall portion 33 which is provided along the edge of the bottom portion 32, and which can surround the printed-circuit board 20, and those are integrated with each other. No wall portion 33 is formed at the portion where the connectors 11 and 12 are placed.

An outer circumferential edge 45 of the cover 40 can be laid over on an upper surface 34 (the edge of the opening 31 of the casing 30) of the wall portion 33 so as to be aligned with each other. The upper surface 34 of the wall portion 33 is provided with female-screw holes 34a to which respective screws 13 for fastening the cover 40 can be tightened.

A plurality of (e.g., four) casing-side support portions 36 and 37 which can support the printed-circuit board 20 is provided inside the casing 30. The casing-side support portions 36 and 37 includes two first casing-side support portions 36 and 36 which can support the first longer edge 24 of the printed-circuit board 20, and two second casing-side support portions 37 and 37 which can support the second longer edge 25 of the printed-circuit board 20. Each of the casing-side support portions 36 and 37 are formed integrally with an upper surface 32a of the bottom portion 32 and an inner circumferential surface 33a of the wall portion 33.

Cover

The cover 40 is formed by sheet-metal processing which is lightweight and low cost in comparison with a metal material (that is formed of aluminum die-casting). The cover 40 includes an opposing surface 42 that can face the upper surface 21 of the printed-circuit board 20. The outer circumferential edge 45 of the cover 40 is provided with through-holes 46 through which the respective screws 13 can pass completely through.

The opposing surface 42 includes a plurality of (e.g., four) cover-side support portions 43 and 44 which can support the upper surface 21 of the printed-circuit board 20. Each of the cover-side support portions 43 and 44 protrudes from the opposing surface 42 toward the printed-circuit board 20. The cover-side support portions 43 and 44 include two first cover-side support portions 43 and 44 that can support the first longer edge 24 of the printed-circuit board 20, and two second cover-side support portions 44 and 44 that can support the second longer edge 25 of the printed-circuit board 20.

Held Portions of Printed-Circuit Board

A portion of the first longer edge 24 of the printed-circuit board 20 which is held between the first casing-side support portion 36 and the first cover-side support portion 43 will be defined as a first held portion 28. The two first held portions 28 are provided. A portion of the second longer edge 25 of the printed-circuit board 20 held between the second casing-side support portion 37 and the second cover-side support portion 44 will be defined as a second held portion 29. The two second held portions 29 are provided.

Although the structure of the second held portion 29 will be described below, this description also describes the structure of the first held portion 28.

Layers Forming Printed-Circuit Board

Figure 3:
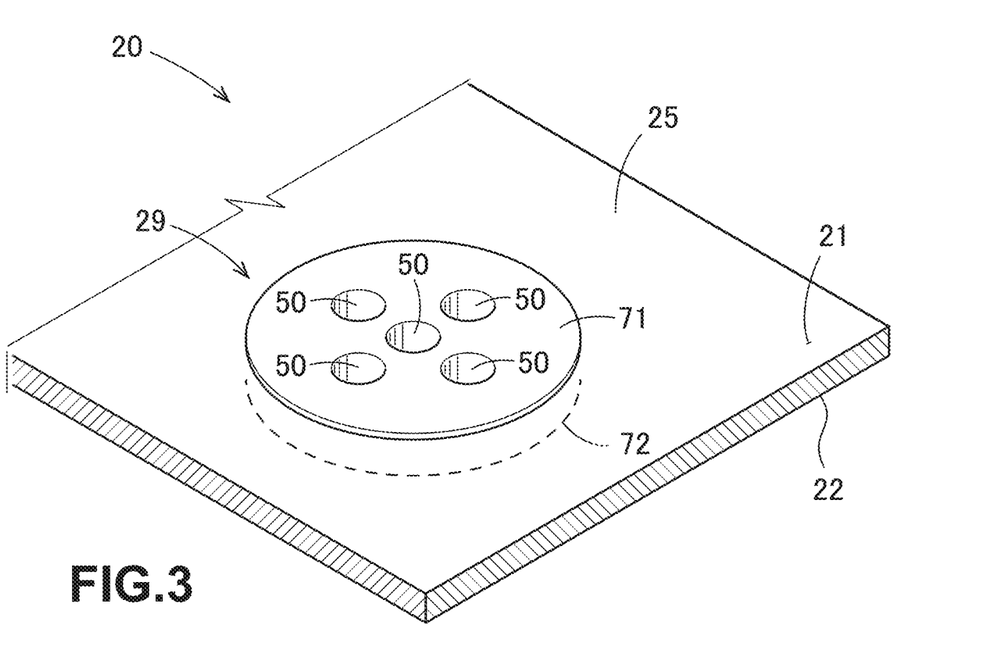
FIG. 3 is a diagram illustrating a portion surrounding by a line indicated by reference numeral 3 in FIG. 2.
Figure 4:
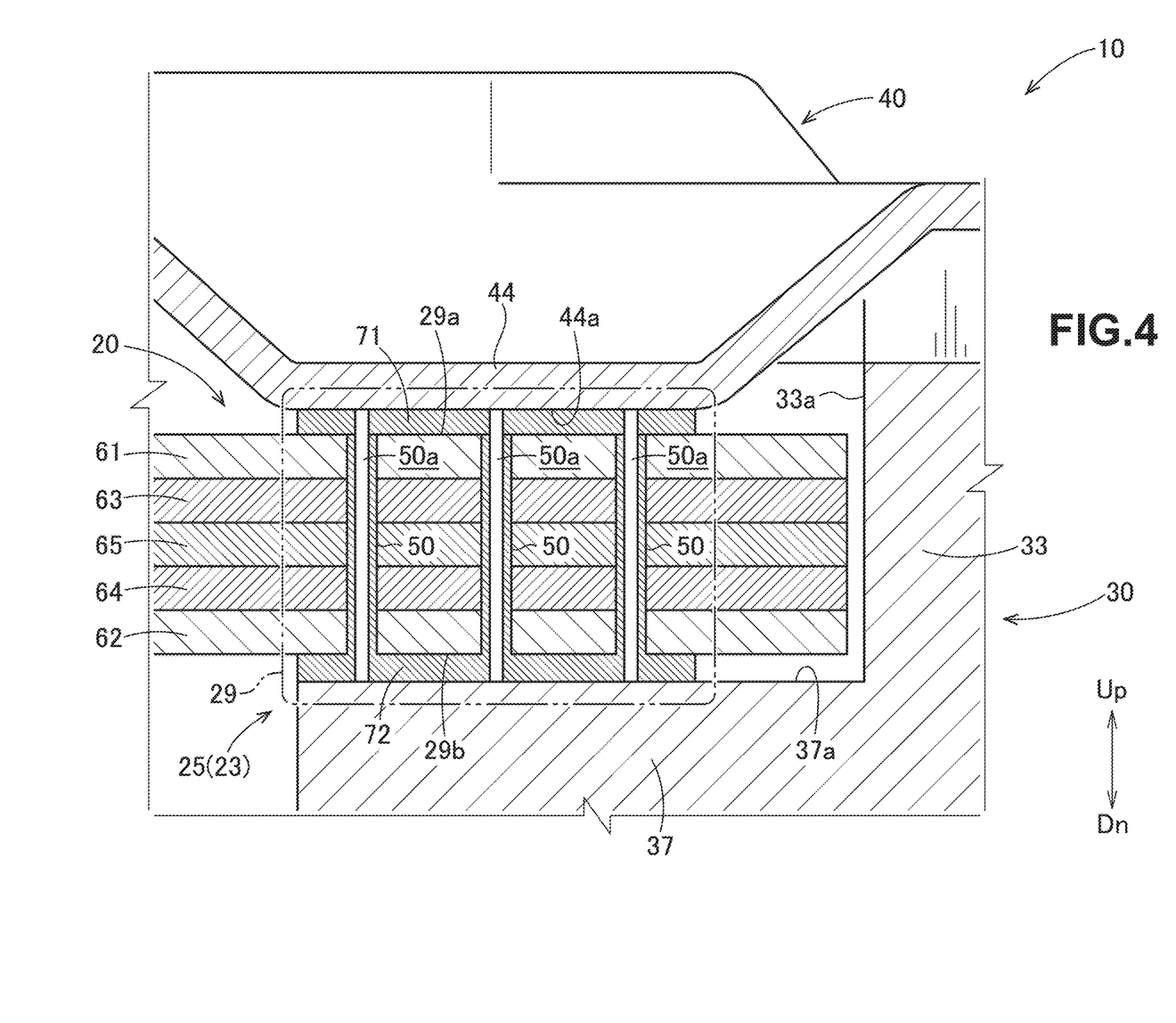
FIG. 4 is a cross-sectional view of FIG. 1 taken along a line 4-4.

With reference to FIG. 3 and FIG. 4, the printed-circuit board 20 is a multilayer substrate, and includes a plurality of (e.g., five) layers 61 to 65. Each of the layers 61 to 65 is formed of an insulating material. The five layers 61 to 65 include a first outer layer 61 (an outermost layer) located at the uppermost side (the cover-40 side), a second outer layer 62 (an outermost layer) located at the lowermost side (the casing-30 side), a first inner layer 63 (an adjacent layer) adjacent to the first outer layer 61, a second inner layer 64 (an adjacent layer) adjacent to the second outer layer 62, and a third inner layer 65 located between the first inner layer 63 and the second inner layer 64.

The first outer layer 61 and the second outer layer 62 are each formed of an inorganic fiber like glass woven fabric, and of a thermosetting resin composition. The thermosetting resin composition contains an epoxy resin and a low elasticity accomplishing agent. The first inner layer 63 to the third inner layer 65 are each formed of an inorganic fiber like glass woven fabric, and of an epoxy resin.

Each held portion is provided with a plurality of (e.g., five) through-hole vias 50 that pass completely through the first outer layer 61 to the second outer layer 62.

Copper Foil

A first copper foil 71 is provided on an upper surface 29a (the surface of the held portion) of the second held portion 29. The first copper foil 71 is in contact with a lower surface 44a (a cover-side contact surface) of the second cover-side support portion 44. The first copper foil 71 is a part of a copper foil pasted on the surface of the first outer layer 61 when the printed-circuit board 20 is manufactured, and is formed together with the wiring pattern on the first outer layer 61.

A second copper foil 72 is provided on a lower surface 29b (the surface of the held portion) of the second held portion 29. The second copper foil 72 is in contact with an upper surface 37a (a casing-side contact surface) of the second casing-side support portion 37. The second copper foil 72 is a part of the copper foil that covers the surface of the second outer layer 62 when the printed-circuit board 20 is manufactured, and is formed together with the wiring pattern of the second outer layer 62. Note that a structure in which only either one of the first copper foil 71 or the second copper foil 72 is formed may be employed.

A hole 50a of the through-hole via 50 passes completely through both the first copper foil 71 and the second copper foil 72.

Elastic Modulus of Insulating Layer

The elastic modulus of the first outer layer 61 is lower than the elastic modulus of the first inner layer 63. The elastic modulus of the second outer layer 62 is lower than the elastic modulus of the second inner layer 64. The elastic modulus of the first outer layer 61 is the same as the elastic modulus of the second outer layer 62. The first inner layer 63 to the third inner layer 65 has the same elastic modulus with each other.

Advantageous Effects of First Embodiment

With reference to FIG. 4, the second longer edge 25 of the printed-circuit board 20 is held between the upper surface 37a of the second casing-side support portion 37 and the lower surface 44a of the second cover-side support portion 44. In comparison with a case in which the printed-circuit board 20 is fastened to the casing 30 using screws like conventional technologies, it can be held with a further large area with respect to the second longer edge 25 of the printed-circuit board 20. This reduces stresses produced at portions of the printed-circuit board 20 which are around the second held portion 29 and to which the respective electronic components are soldered.

In addition, the second held portion 29 of the printed-circuit board 20 is provided with the plurality of (e.g., five) through-hole vias 50. Since each through-hole via 50 serves as a cylindrical reinforcement member that extends in the thickness direction of the printed-circuit board 20, the strength of the printed-circuit board 20 in the thickness direction can be enhanced.

Moreover, the first copper foil 71 is provided on the upper surface 29a of the second held portion 29. The second copper foil 72 is provided on the lower surface 29b of the second held portion 29. This enables the first outer layer 61 of the printed-circuit board 20 and the second outer layer 62 thereof to be protected, resulting in the enhancement of the strength of the printed-circuit board 20 in the thickness direction.

Furthermore, the casing 30 is manufactured by aluminum die-casting, and the cover 40 is manufactured by sheet-metal processing. Hence, the second held portion 29 of the printed-circuit board 20 can be utilized as a frame ground for the electronic circuit.

Still further, the elastic modulus of the first outer layer 61 is lower than the elastic modulus of the first inner layer 63. The elastic modulus of the second outer layer 62 is lower than the elastic modulus of the second inner layer 64. That is, in the second held portion 29 of the printed-circuit board 20, the first outer layer 61 and the second outer layer 62 are likely to be deformed in comparison with the first inner layer 63 to the third inner layer 65. Since force produced by being held between the cover-side support portion 44 and the casing-side support portion 37 can be distributed across the entire printed-circuit board 20, stresses produced at portions which are around the second held portion 29 and to which the respective electronic components are soldered can be reduced.

Yet still further, with reference to FIG. 2, the first longer edge 24 of the printed-circuit board 20 is supported by the two first casing-side support portions 36 and the two first cover-side support portions 43. The second longer edge 25 of the printed-circuit board 20 is supported by the two first casing-side support portions 36 and the two first cover-side support portions 43. Since both ends 24 and 25 of the printed-circuit board 20 are supported, the printed-circuit board 20 can be surely fastened to the casing 30. Note that instead of the structure that supports the longer edges 24 and 25, the shorter edges 26 and 27 may be supported.

The above-described advantageous effects of the present disclosure can be also accomplished in a second embodiment to be described below.

Second Embodiment

Figure 5:
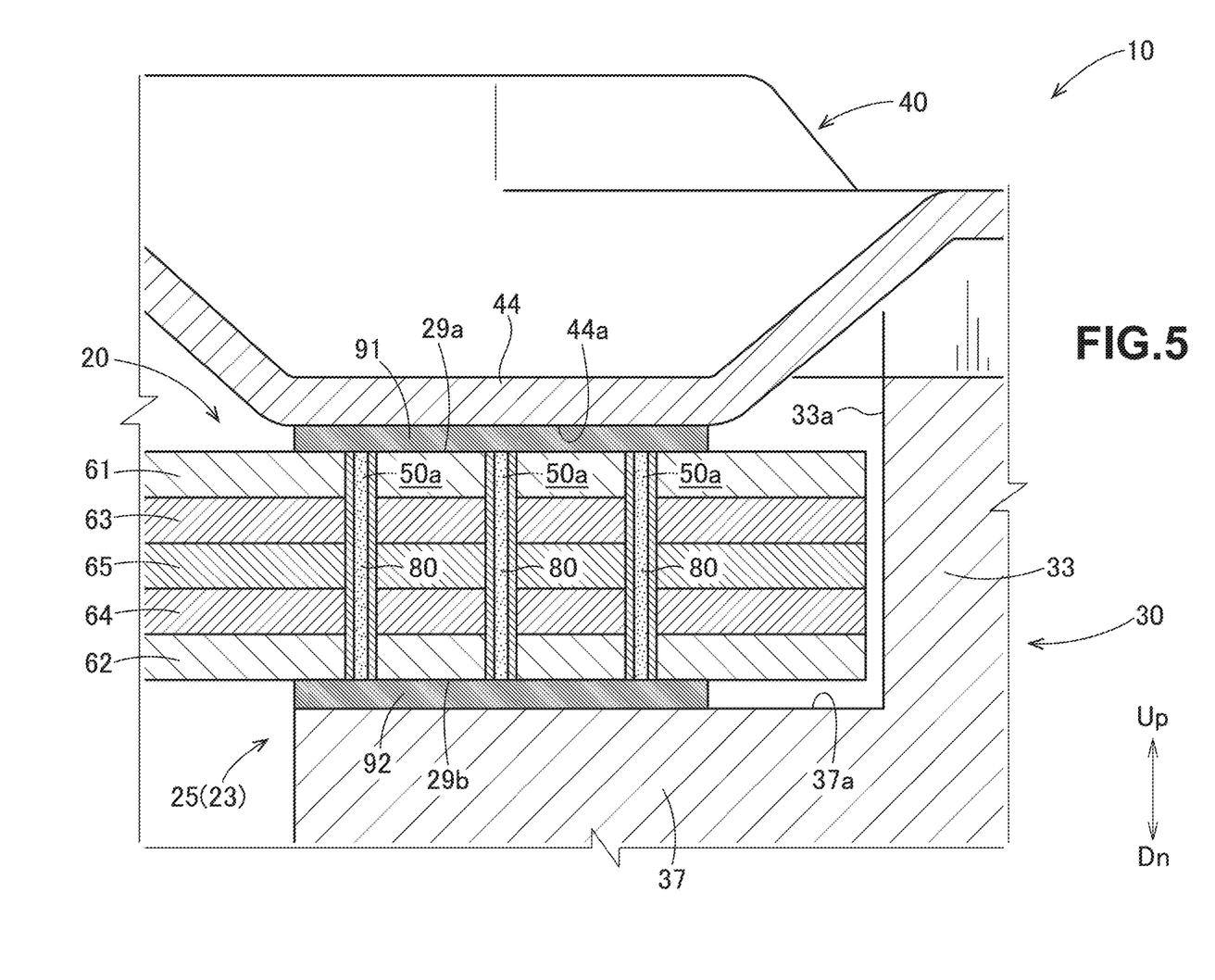
FIG. 5 is a cross-sectional view of an electronic control device according to a second embodiment.

FIG. 5 illustrates an electronic control device 10A according to the second embodiment. The same structure as that of the electronic control device 10 (see FIG. 4) according to the first embodiment will be denoted by the same reference numeral, and the duplicated description thereof will be omitted.

A hole 50a of each through-hole via 50 is filled by a filler member 80 (e.g., a resin material). A first copper plating portion 91 formed by copper plating is provided on the upper surface 29a of the second held portion 29. The first copper plating portion 91 covers the through-hole vias 50 and the filler members 80. The first copper plating portion 91 is in contact with the lower surface 44a of the second cover-side support portion 44.

A second copper plating portion 92 formed by copper plating is provided on the lower surface 29b of the second held portion 29. The second copper plating portion 92 covers the through-hole vias 50 and the filler members 80. The second copper plating portion 92 is in contact with the upper surface 37a of the second casing-side support portion 37.

Note that the material of plating is not limited to copper, and a metal suitable for plating can be selected as appropriate. Moreover, a structure in which only either one of the first copper plating portion 91 or the second plating portion 92 is provided may be employed.

Advantageous Effects of Second Embodiment

Since the hole 50*a* of each through-hole via 50 is filled by the filler member 80, each through-hole via 50 can be reinforced, and thus the strength of the second held portion 29 in the thickness direction can be enhanced.

Moreover, the first copper plating portion 91 formed by copper plating is provided on the upper surface 29*a* of the second held portion 29. The second copper plating portion 92 formed by copper plating is provided on the lower surface 29*b* of the second held portion 29. These first plating portion and the second plating portion cover the through-hole vias 50 and the filler members 80. Accordingly, a contact area of the first plating portion and that of the second plating portion to the casing 30 and to the cover 40 increase, and thus a heat dissipation effect increases.

As far as the actions and advantageous effects of the present disclosure are accomplishable, the present disclosure is not limited to the above-described embodiments.

What is claimed is:

1. An electronic control device comprising:
   a casing which is provided with an opening and which stores therein a printed-circuit board; and
   a cover that blocks off the opening of the casing,
   wherein an outer circumferential edge of the cover is fastened so as to be laid over on an edge of the opening of the casing and so as to be aligned with each other,
   wherein the casing comprises a casing-side contact surface that is in contact with an end of the printed-circuit board at an internal side relative to the edge of the opening of the casing,
   wherein the cover comprises a cover-side contact surface that holds the end of the printed-circuit board together with the casing-side contact surface by being in contact with the end of the printed-circuit board,
   wherein, in the printed-circuit board, a held portion held between the casing-side contact surface and the cover-side contact surface is provided with a through-hole via.

2. The electronic control device according to claim 1, wherein:
   a copper foil is provided on a surface of the held portion of the printed-circuit board; and
   a hole of the through-hole via passes completely through the copper foil.

3. The electronic control device according to claim 2, wherein:
   the printed-circuit board is formed by laminating a plurality of insulating layers; and
   with reference to a thickness direction of the printed-circuit board, an elastic modulus of an outermost layer located at the outermost side is lower than an elastic modulus of an adjacent layer adjacent to the outermost layer.

4. The electronic control device according to claim 3, wherein:
   a plurality of the casing-side contact surfaces and a plurality of the cover-side contact surfaces are provided; and
   the plurality of the casing-side contact surfaces and the plurality of the cover-side contact surfaces are placed along a pair of edges of the printed-circuit board which extend in a same direction.

5. The electronic control device according to claim 2, wherein:
   a plurality of the casing-side contact surfaces and a plurality of the cover-side contact surfaces are provided; and
   the plurality of the casing-side contact surfaces and the plurality of the cover-side contact surfaces are placed along a pair of edges of the printed-circuit board which extend in a same direction.

6. The electronic control device according to claim 1, wherein:
   a hole of the through-hole via is filled by a filler member;
   a surface of the held portion of the printed-circuit board is provided with a plating portion formed by plating; and
   the plating portion covers the through-hole via and the filler member.

7. The electronic control device according to claim 6, wherein:
   the printed-circuit board is formed by laminating a plurality of insulating layers; and
   with reference to a thickness direction of the printed-circuit board, an elastic modulus of an outermost layer located at the outermost side is lower than an elastic modulus of an adjacent layer adjacent to the outermost layer.

8. The electronic control device according to claim 7, wherein:
   a plurality of the casing-side contact surfaces and a plurality of the cover-side contact surfaces are provided; and
   the plurality of the casing-side contact surfaces and the plurality of the cover-side contact surfaces are placed along a pair of edges of the printed-circuit board which extend in a same direction.

9. The electronic control device according to claim 6, wherein:
   a plurality of the casing-side contact surfaces and a plurality of the cover-side contact surfaces are provided; and
   the plurality of the casing-side contact surfaces and the plurality of the cover-side contact surfaces are placed along a pair of edges of the printed-circuit board which extend in a same direction.

10. The electronic control device according to claim 1, wherein:
    the printed-circuit board is formed by laminating a plurality of insulating layers; and
    with reference to a thickness direction of the printed-circuit board, an elastic modulus of an outermost layer located at the outermost side is lower than an elastic modulus of an adjacent layer adjacent to the outermost layer.

11. The electronic control device according to claim 10, wherein:
    a plurality of the casing-side contact surfaces and a plurality of the cover-side contact surfaces are provided; and
    the plurality of the casing-side contact surfaces and the plurality of the cover-side contact surfaces are placed along a pair of edges of the printed-circuit board which extend in a same direction.

12. The electronic control device according to claim 1, wherein:
- a plurality of the casing-side contact surfaces and a plurality of the cover-side contact surfaces are provided; and
- the plurality of the casing-side contact surfaces and the plurality of the cover-side contact surfaces are placed along a pair of edges of the printed-circuit board which extend in a same direction.

* * * * *